United States Patent [19]

Tang

[11] Patent Number: 4,763,223
[45] Date of Patent: Aug. 9, 1988

[54] NON-SOLDERED LEAD APPARATUS

[75] Inventor: Sang T. Tang, Pomona, Calif.

[73] Assignee: Babcock Display Products, Inc., Anaheim, Calif.

[21] Appl. No.: 938,428

[22] Filed: Dec. 5, 1986

[51] Int. Cl.⁴ .............................................. H05K 1/02
[52] U.S. Cl. .................................. 361/380; 174/52 S; 313/512; 427/66; 428/690
[58] Field of Search ................. 29/569 L; 174/52 FP, 174/52 S; 313/506, 509, 511–512, 380; 361/404–405, 408; 427/66; 428/690, 919

[56] References Cited

U.S. PATENT DOCUMENTS

| | | | |
|---|---|---|---|
| 3,238,859 | 3/1966 | Mauchly | 313/512 |
| 3,243,629 | 3/1966 | Levetan | 313/512 |
| 3,281,619 | 10/1966 | Greene | 313/512 |
| 3,868,676 | 2/1975 | Hennessey et al. | 361/408 |
| 4,627,533 | 12/1986 | Pollard | 174/52 FP |
| 4,649,416 | 3/1987 | Borkowski et al. | 174/52 FP |
| 4,656,442 | 4/1987 | Hayakawa | 361/405 |

Primary Examiner—A. D. Pellinen
Assistant Examiner—Gregory N. Thompson
Attorney, Agent, or Firm—G. Donald Weber, Jr.

[57] ABSTRACT

An apparatus including terminals for electronic devices such as display units or the like. The terminals are hermetically sealed into the structure of the electronic device during the assembly thereof. The terminal includes a bent, resilient end portion at the internal end thereof to make contact with electrical conductors within the device. The other end of the terminal extends beyond the edge of the device. The mid-region of the terminal is retained within the hermetic seal which is disposed adjacent to the edge of the apparatus.

15 Claims, 1 Drawing Sheet

NON-SOLDERED LEAD APPARATUS

BACKGROUND

1. Field of the Invention.

This invention is directed to leads or terminal devices, in general, and to leads which are associated with electronic assemblies such as display units or assemblies, in particular.

2. Prior Art.

In the electronic industry, there are many types of electronic elements or devices which utilize leads or terminals which extend therefrom. These types of leads are found in many integrated circuit devices or packages, as well as many other types of assemblies. These leads are used to effect an interconnection between an internal portion of the device and an external source, a utilization device, or the like.

One type of device or assembly which uses this type of lead or terminal is a display device. Typical examples of the display devices so constructed are plasma discharge displays, liquid crystal displays or other types of gas displays which comprise a sealed envelope having an excitable or activatable material encased therein. The envelope includes a face plate and a back plate on which electronic conductors are disposed by any one of many processes such as material deposition, material etching, or the like. These plates are spaced apart whereupon the conductors produce an electric field therebetween whenever energized by application of electrical signals thereto. This field is also produced through or across the activation material (gas, liquid crystal or the like) which is disposed between the plates. The field operates to alter the state of the material so as to effect a display. That is, the material is aligned to control light passing therethrough, to glow or the like.

The construction of these types of devices using face plates, back plates, and a sealing arrangement is well known in the art. However, the design of the display, especially as related to the terminals, and the method of assembling the display and terminals is an area of constant investigation in order to improve the operation of the device and to reduce the cost of fabrication thereof.

PRIOR ART STATEMENT

A search of the prior art has uncovered the following patents which are listed in numerical order:

U.S. Pat. No. 3,280,378; MEANS FOR ANCHORING AND CONNECTING LEAD WIRES IN AN ELECTRICAL COMPONENT; Brady et al. This patent is directed to a circuit module comprising a plurality of electrical devices supported on a substrate of ceramic dielectric material with anchoring means for the lead wires or terminal pins.

U.S. Pat. No. 3,700,788; ELECTRIC COMPONENT PACKAGE; Spurck. This patent is directed to a package for electrical components comprising a carrier for encapsulating the components and a socket for receiving the carrier which socket includes a plurality of electrical connectors which engage deposited conductive patterns on the flat pack carrier to complete electrical circuit connections.

U.S. Pat. No. 3,868,676; DISPLAY PANEL ELECTRODE TERMINATION; Hennessey et al. This patent is directed to display panels with electrode terminals disposed on at least one of the insulating base plate and cover plate and which are deformed when mated with the device in order to provide pressure or friction contact with electrode terminals and, further, shaped to receive one or more tabs extending out of the device for securing together and for providing electrical connection to the device.

U.S. Pat. No. 4,039,882; EDGE TERMINATIONS FOR GAS DISCHARGE DISPLAY PANEL; Kupsky et al. This patent is directed to a gas discharge display device with printed conductors passing through a seal area between the substrates.

U.S. Pat. No. 4,127,934; METHOD OF MAKING TERMINAL CONSTRUCTION FOR ELECTRICAL CIRCUIT DEVICE; Bartley, et al. This patent is directed to an electrical circuit device including terminal leads positioned in openings in the device with a deformation intermediate the ends of the leads.

U.S. Pat. No. 4,282,003; METHOD FOR CONSTRUCTING A SELF-REGULATING ELECTRIC HEATER; Yashin et al. This patent is directed to a heater device comprising a cylindrical body which includes a method of limiting the insertion of spring biased terminals therein with a sealant material disposed on the open end of the body with the terminal leads extending therethrough.

U.S. Pat. No. 4,543,714; MACHINE INSERTION OF CIRCUIT MODULE TERMINALS; Seffernick et al. This patent is directed to a method and apparatus for the insertion of circuit module terminals during the production of miniature resistor networks.

SUMMARY OF THE INSTANT INVENTION

There is described an apparatus wherein leads or terminals are provided on an electronic structure, in particular, a display device or assembly. The terminals extend inwardly into the device and include a bent end portion for making internal contact in the device and an external end for making contact for external devices. The apparatus with which the leads are used includes a first seal disposed between the two plates, of, for example, a display device in order to define a chamber at an inner portion thereof. A second seal which is, typically, an extension of the first seal and disposed at the edge of the two plates of the device is arranged to maintain the terminals or leads within the apparatus in an hermetically sealed location.

In the preferred embodiment, the respective face plates (or substrates) are coextensive and include electrical conductor pads on the adjacent surfaces.

DESCRIPTION OF THE PREFERRED EMBODIMENT

Figure 1:
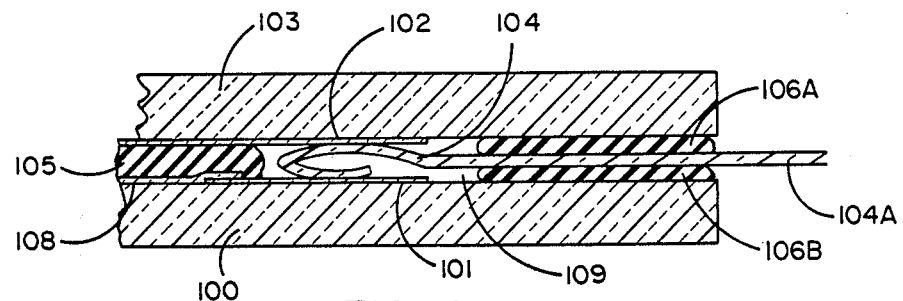
FIG. 1 is a cross-sectional view of a portion of an apparatus using the instant invention.
Figure 2:
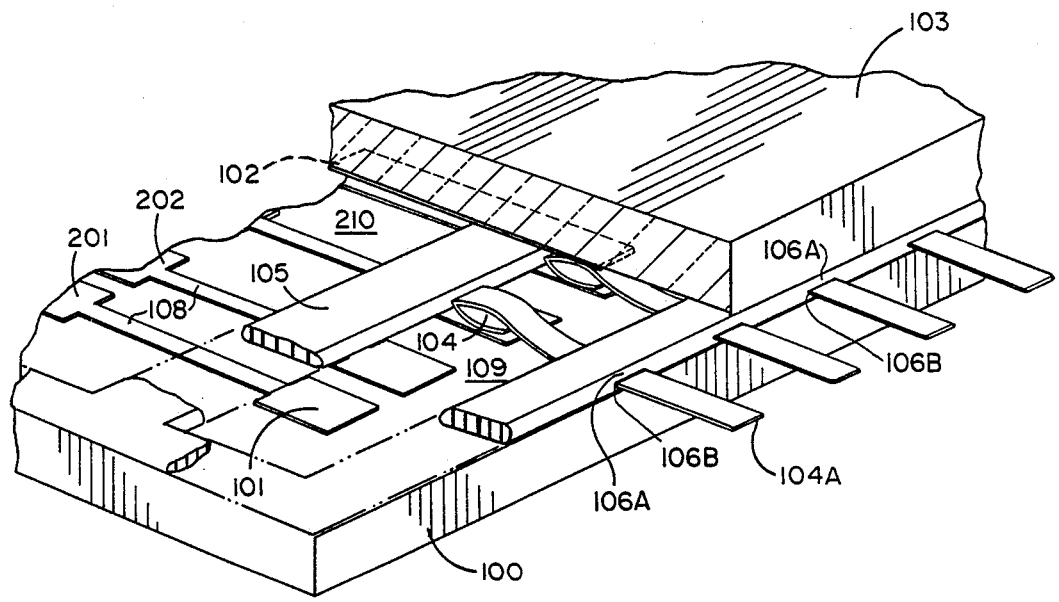
FIG. 2 is a perspective view of a portion of the apparatus which is broken away to shown the seveal layers of the apparatus including one embodiment of the instant invention.

Referring concurrently to FIGS. 1 and 2, there are shown a portion of a cross-sectional view and a partially broken away, perspective view of the subject invention, respectively.

While not necessarily so limited, the invention is directed primarily to a display type device of generally conventional construction. In a particular embodiment, the display is of the "gas-display" type. That is, a pair of substrates are provided. In this case, the first substrate is considered to be the back plate 100 while the other substrate is considered to be the face plate 103. In a typical fashion, these substrates or plates can be fabricated of glass or any other suitable material. In the typical arrangement, the plates 100 and 103 are fabricated of glass with selected regions of opacity (or, conversely, regions of transparency) provided by a suitable coating on the glass, an appropriate fabrication of the glass, or the like. In addition, appropriate electrodes some of which are transparent are deposited or otherwise formed on the adjacent surfaces of the substrates in accordance with a prescribed pattern. Typically, the pattern is arranged to produce alpha-numeric (and other) characters in accordance with the 7-segment pattern. Thus, by appropriate activation of related segment electrodes, such as electrodes 201 and 202, for example, an electric field is produced therebetween. This electric field is operative to energize (activate) the gas (or other material) which is disposed between the electrodes so as to produce a visible character, for example by causing the gas to glow.

While not part of this invention, per se, various techniques can be used for producing these electrodes. Moreover, various types of gas or other material can be disposed between the substrates in order to selectively produce the desired display effect. The materials which can be used include materials such as neon, argon, fluorescent materials, or the like, which produce different types of glow such as orange, blue, white, or the appropriate hue developed by the material.

In addition, the display can be fabricated to use liquid crystals, which can be nematic, cholesteric or the like. A dichroic dye can be used in some instances. However, the type of display material is not critical to the invention, per se.

In accordance with this invention, a new and unique lead arrangement is provided. Thus, the typical seal arrangement 105 is provided between the pair of substrates. Thus, a completely enclosed, hermetically sealed cavity 210 (see FIG. 2) is produced between the substrates 100 and 103 and surrounded by the seal 105. It is in this area that the display electrodes as well as the display material are disposed. Consequently, it is this area which produces the visual display portion of the apparatus of the instant invention.

It is seen that the anode contact 102 which is connected to the internal electrodes within the cavity 210, for example by conductors 108 extends beyond the seal 105 along the surface of the face plate 103. In like fashion, the cathode contact 101 extends beyond seal 105 on the surface of the back plate or substrate 100. These contacts can be etched or otherwise disposed on the surface of the face plate during the initial operation when the electrodes are formed at the inner portion thereof.

It is noted that neither the anode contact 102 nor the cathode contact 101 extend all the way to the edge of the respective substrates 100 and 103. While it is conceivable that they could so extend, it is not necessary to do so. Moreover, by reducing the length of the contacts, undesirable short circuit conditions can be avoided at the edges of the apparatus.

As seen best in FIG. 2, the cathode contact 101 is disposed on the upper surface of substrate 100 while anode contact 102 is disposed on the lower surface of face plate 103. These contacts are disposed in spaced apart horizontal and vertical alignment relative to each other when the substrates 100 and 103 are mounted together. Of course, certain of the contracts on both substrates can be in vertical alignment so as to be connected together via a common terminal lead.

The terminal lead 104 is shown to include a portion thereof which is reversed-upon-itself so as to have a spring loaded effect. Thus, when it is disposed between the substrates 100 and 103, a spring contact is made to the cathode or anode contacts 101 and 102, respectively. This spring contact arrangement also maintains an electrical connection with these contacts. In actual practice, a terminal 104 will usually not engage both anode and cathode contacts 102 and 101 at the same time. However, in the event that a cross-over connection is required from one substrate to the other, this interconnection can be made.

The elongated tail 104A of the terminal 104 extends outwardly beyond the coextensive ends of the substrates 100 and 103. In addition, a further hermetic seal 106 is provided at the outer edge between the substrates 100 and 103. This seal 106 is arranged to encapsulate the mid-portion of the tail 104A of the terminal 104. Thus, the terminal 104 is spaced substantially intermediate the ends of the substrates 100 and 103.

As seen in FIG. 1, seal 106 has portions 106A and 106B thereof disposed above and below tail 104A. Even though the seal 106 can comprise one or more layers, for example, layers 106A and 106B, a single seal is contemplated.

The connections between the terminal 104 and the respective contacts 101 and 102 are now maintained between the substrates 100 and 103, as well as being surrounded by the combination of seals 106 and 105, thus each connection is hermetically sealed thereby preventing any undesirable corrosion or the like at the connector.

After the apparatus has been assembled as noted, appropriate arrangements can be made through standard techniques to either evacuate the cavities or chambers 109 and 210 or to insert a preferred gas for the display chamber 210 and an inert gas in the chamber 109.

After the apparatus has been assembled, the appropriate exhausting operation takes place, the insertion of the gas is provide, the leads are trimmed and tinned, if necessary. In addition, baking, burn-in, testing and other assembly functions can take place in order to make sure that the device operates properly.

Figure 3:
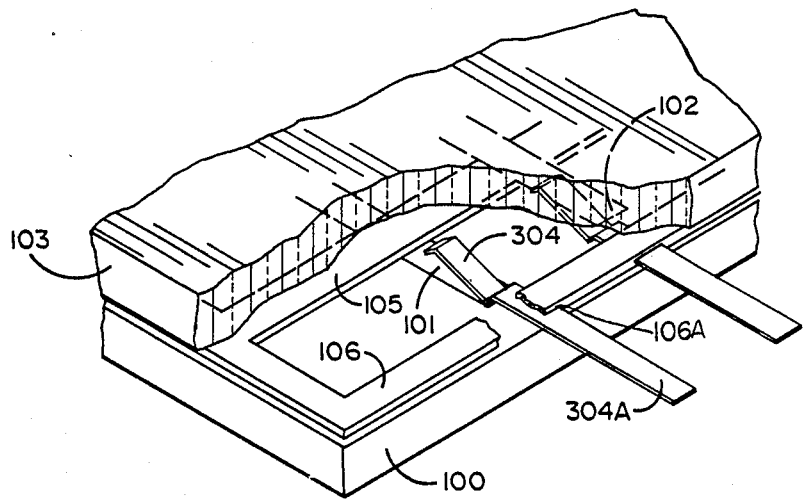
FIG. 3 is another perspective, broken away view of a portion of the apparatus which shows another embodiment of the instant invention.

Referring now to FIG. 3, there is shown another embodiment of the invention. Components which are similar to previously described components bear similar reference numerals.

In this embodiment, the internal end 304 of the terminal 104 is comprised of a section having compound bends. Thus, the internal end 304 is substantially Z-shaped or S-shaped. This device does not have the pronounced U-shaped configuration of the interior end of terminal 104 in FIG. 1. However, this terminal does include the resilient characteristic wherein a spring-contact is produced between the internal surfaces of the contacts 101 and 102 within the hermetically sealed chamber 109. The elongated terminal tail 304A is similar to elongated terminal tail 104A (FIGS. 1 and 2).

Thus, there is shown and described a new terminal assembly apparatus which can be used with various electronic devices such as display devices. However, the major thrust of this invention is to provide a second hermetically sealed envelope around that area where the terminal is connected joined to the internal contacts of the apparatus. The terminals are, thus, directly sealed into the structure of the display device during the assembly of the face plate and the back plate substrates. The terminal which includes a spring-type terminal comprised of a resilient material, produces a connection to the contacts (conductors) which have been formed on the internal portions of the assembly. Thus, the actual terminal connections are isolated from the electrically active area and, as well, from the outside environment.

While a preferred embodiment of the invention has been described, it is clear that those skilled in the art may consider or conceive modifications thereto. However, any such modifications which fall in the purview of this description are intended to be included therein as well. This description is intended to be illustrative only and is not intended to be limitative. Rather the scope of the invention is limited only by the scope of the claims appended hereto.

I claim:

1. A display apparatus comprising,
    a pair of spaced apart substrates (100, 103),
    at least one of said substrates (103) having a transparent portion thereof,
    first and second sealing means (105, 106) disposed between said pair of spaced apart substrates to retain said substrates in position and to define two separate but adjacent hermetically sealed chambers (109, 210) between said pair of spaced apart substrates,
    electrodes (201, 202) disposed in a predetermined pattern on at least one surface of each of said substrates, and
    electrical terminals (104) adapted to make electrical contact with said electrodes in one of said chambers (109) and extending outwardly through one of said sealing means (106) and beyond said pair of substrates.

2. The apparatus recited in claim 1 wherein, said first and second sealing means (105, 106) surround one of said chambers, and wherein said one of said sealing means (106) is adjacent to edges of said pair of substrates.

3. The apparatus recited in claim 1 wherein, said electrical terminals (104) have a mid-portion thereof embedded within said one of said sealing means.

4. The apparatus recited in claim 1 wherein,
    the interior ends of said electrical terminals within said one of said chambers are conformed to abut the surfaces of each of said pair of substrates and electrodes disposed thereon.

5. The apparatus recited in claim 4 wherein, said interior ends of said electrical terminals each has a portion thereof reversed upon itself.

6. The apparatus recited in claim 4 wherein,
    said interior ends of said electrical terminals have at least two portions thereof including angles of 90° or greater.

7. The apparatus recited in claim 1 wherein
    said electrical terminals are formed of resilient, electrically conductive material.

8. The apparatus recited in claim 1 including,
    a material disposed in a second (210) one of said chambers which is characterized by having certain properties thereof altered when subjected to the application of an electrical field thereto.

9. The apparatus recited in claim 8 wherein,
    said material comprises a glow discharge type gas.

10. The apparatus recited in claim 1 wherein,
    said pair of spaced apart substrates are of the same size.

11. The apparatus recited in claim 1 wherein,
    said pair of spaced apart substrates are both formed of glass.

12. The apparatus recited in claim 8 wherein,
    said material comprises a liquid crystal.

13. The apparatus recited in claim 1 wherein,
    said electrodes comprise transparent, electrically conductive material.

14. The apparatus recited in claim 1 wherein, said first and second sealing means are joined together.

15. A display device comprising,
    first and second co-extensive planar substrates,
    at least one of said substrates fabricated of glass and arranged to have regions of opacity and regions of transparency,
    electrodes formed on the adjacent surfaces of said first and second substrates in a prescribed pattern whereby an electric field can be produced between said electrodes,
    contact means electrically connected to said electrode means,
    sealing means disposed between said first and second substrates so as to provide two separate, hermetically sealed chambers between said first and second substrates,
    said electrodes disposed within a first one of said chambers and said contact means disposed within a second one of said chambers, and
    terminal means comprising an internal end, a tail portion and a mid-portion,
    said mid-portion is embedded in said sealing means,
    said tail portion extends beyond said sealing means and said coextensive substrates,
    said internal end extends into said second chamber,
    said internal end has a U-shaped portion which makes a spring-loaded electrical connection with said contact means within said second chamber.

* * * * *